(12) United States Patent
Liang et al.

(10) Patent No.: US 11,855,215 B2
(45) Date of Patent: Dec. 26, 2023

(54) SEMICONDUCTOR DEVICE STRUCTURE WITH HIGH CONTACT AREA

(71) Applicant: Taiwan Semiconductor Manufacturing Company, Ltd., Hsinchu (TW)

(72) Inventors: Shuen-Shin Liang, Hsinchu County (TW); Pang-Yen Tsai, Jhu-bei (TW); Keng-Chu Lin, Ping-Tung (TW); Sung-Li Wang, Zhubei (TW); Pinyen Lin, Rochester, NY (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/855,992

(22) Filed: Jul. 1, 2022

(65) Prior Publication Data
US 2022/0336655 A1   Oct. 20, 2022

Related U.S. Application Data

(63) Continuation of application No. 16/876,466, filed on May 18, 2020, now Pat. No. 11,393,924.

(51) Int. Cl.
*H01L 29/78*   (2006.01)
*H01L 29/06*   (2006.01)
*H01L 29/423*  (2006.01)
*H01L 29/66*   (2006.01)
*B82Y 40/00*   (2011.01)

(52) U.S. Cl.
CPC ........ *H01L 29/785* (2013.01); *H01L 29/0676* (2013.01); *H01L 29/4238* (2013.01); *H01L 29/42392* (2013.01); *H01L 29/66545* (2013.01); *H01L 29/7827* (2013.01); *B82Y 40/00* (2013.01); *H01L 2029/7858* (2013.01)

(58) Field of Classification Search
CPC ............. H01L 29/785; H01L 29/42392; H01L 2029/7858; H01L 29/0676; H01L 29/4238; H01L 29/66545; H01L 29/7827
See application file for complete search history.

(56) References Cited

U.S. PATENT DOCUMENTS 9,209,247 B2   12/2015   Colinge et al.
9,236,267 B2   1/2016    De et al.
(Continued)

*Primary Examiner* — Changhyun Yi
(74) *Attorney, Agent, or Firm* — Birch, Stewart, Kolasch & Birch, LLP

(57) ABSTRACT

A semiconductor device structure is provided. The semiconductor device structure includes a first semiconductor nanostructure and a second semiconductor nanostructure stacked over a substrate. The semiconductor device structure also includes a first epitaxial structure connecting the first semiconductor nanostructure and a second epitaxial structure connecting the second semiconductor nanostructure. The semiconductor device structure further includes a gate stack wrapped around the first semiconductor nanostructure and the second semiconductor nanostructure. In addition, the semiconductor device structure includes a conductive contact electrically connected to the epitaxial structures. The conductive contact has a portion extending towards the gate stack from terminals of the first epitaxial structure and the second epitaxial structures. The first epitaxial structure is wider than the portion of the conductive contact.

20 Claims, 19 Drawing Sheets

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 11,393,924 B2 * | 7/2022 | Liang .................. H01L 29/7827 |
| 2017/0256609 A1 | 9/2017 | Bhuwalka et al. |
| 2018/0294331 A1 | 10/2018 | Cho et al. |
| 2019/0181224 A1 * | 6/2019 | Zhang ............... H01L 29/66553 |
| 2019/0198616 A1 * | 6/2019 | Coquand ........... H01L 29/41725 |
| 2019/0378842 A1 * | 12/2019 | Reznicek ............ H01L 29/4175 |

* cited by examiner

SEMICONDUCTOR DEVICE STRUCTURE WITH HIGH CONTACT AREA

This application is a Continuation application of U.S. patent application Ser. No. 16/876,466, filed on May 18, 2020, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
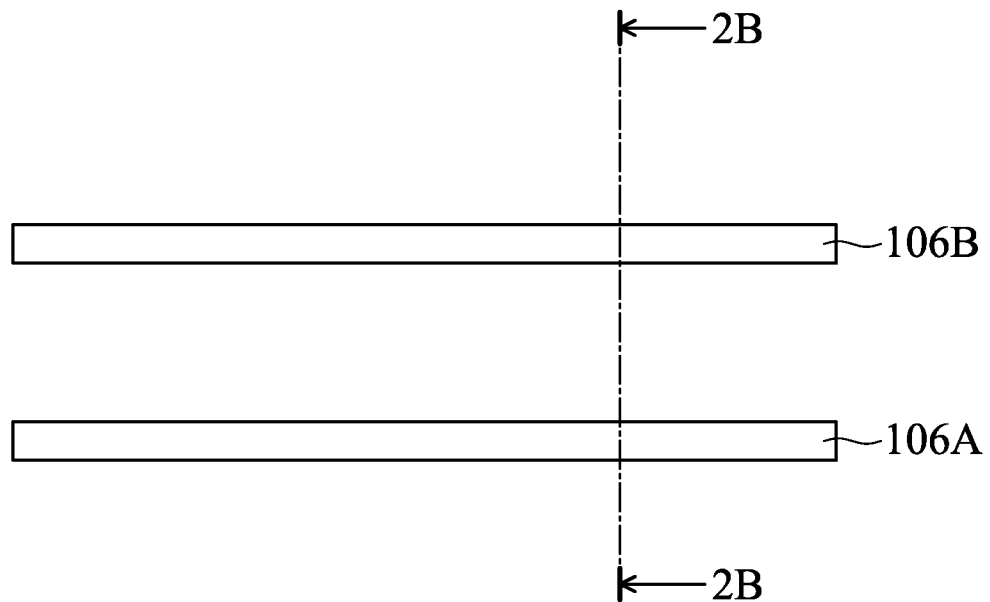
FIGS. 1A-1B are top views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Embodiments of the disclosure may relate to FinFET structure having fins. The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Embodiments of the disclosure may relate to the gate all around (GAA) transistor structures. The GAA structure may be patterned using any suitable method. For example, the structures may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 2A:
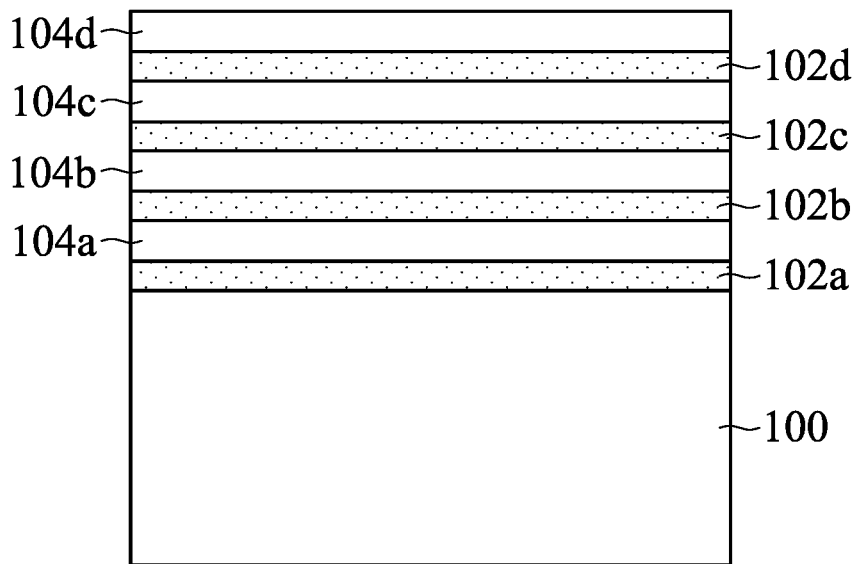
FIGS. 2A-2D are cross-sectional views of various stages of a process for forming a semiconductor device structure, in accordance with some embodiments.

FIGS. 2A-2D are cross-sectional views of various stages of a process for forming a semiconductor device structure, in accordance with some embodiments. As shown in FIG. 2A, a semiconductor substrate 100 is received or provided. In some embodiments, the semiconductor substrate 100 is a bulk semiconductor substrate, such as a semiconductor wafer. The semiconductor substrate 100 may include silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 2A, a semiconductor stack having multiple semiconductor layers is formed over the semiconductor substrate 100, in accordance with some embodiments. In some embodiments, the semiconductor stack includes multiple semiconductor layers 102a, 102b, 102c, and 102d, and the semiconductor stack also includes multiple semiconductor layers 104a, 104b, 104c, and 104d. In some embodiments, the semiconductor layers 102a-102d and the semiconductor layers 104a-104d are laid out alternately, as shown in FIG. 2A.

In some embodiments, the semiconductor layers 102a-102d function as sacrificial layers that will be removed in subsequent processes to release the semiconductor layers 104a-104d. The semiconductor layers 104a-104d may function as channel structures of one or more transistors.

In some embodiments, each of the semiconductor layers 102a-102d and 104a-104d has substantially the same thickness. In some embodiments, each of the semiconductor layers 104a-104d is thicker than each of the semiconductor layers 102a-102d. In some other embodiments, each of the semiconductor layers 102a-102d is thicker than each of the semiconductor layers 104a-104d.

In some embodiments, the semiconductor layers 102a-102d and the semiconductor layers 104a-104d are made of different materials. In some embodiments, the semiconductor layers 102a-102d are made of or include silicon germanium or germanium, and the semiconductor layers 104a-104d are made of or include silicon. In some other embodiments, the semiconductor layers 102a-102d are made of or include silicon, and the semiconductor layers 104a-104d are made of or include silicon germanium or germanium. In some other embodiments, both the semiconductor layers 102a-102d and 104a-104d are made of silicon germanium. However, the atomic concentration of germanium of the semiconductor layers 102a-102d is different than that of the semiconductor layers 104a-104d. Embodiments of the disclosure are not limited thereto. Other different semiconductor materials may be used as the semiconductor layers 102a-102d and 104a-104d. For example, the semiconductor layers 102a-102d, that function as sacrificial layers, may be made of SiP, SiC, SiOCN, one or more other suitable materials, or a combination thereof.

In some embodiments, the semiconductor layers 102a-102d and the semiconductor layers 104a-104d are formed using multiple epitaxial growth operations. Each of the semiconductor layers 102a-102d and the semiconductor layers 104a-104d may be formed using a selective epitaxial growth (SEG) process, a chemical vapor deposition (CVD) process (e.g., a vapor-phase epitaxy (VPE) process, a low-pressure chemical vapor deposition (LPCVD) process, and/or an ultra-high vacuum CVD (UHV-CVD) process), a molecular beam epitaxy process, an atomic layer deposition (ALD) process, one or more other applicable processes, or a combination thereof. In some embodiments, the semiconductor layers 102a-102d and the semiconductor layers 104a-104d are grown in-situ in the same process chamber. In some embodiments, the growth of the semiconductor layers 102a-102d and the growth of the semiconductor layers 104a-104d are alternately and sequentially performed in the same process chamber to complete the formation of the semiconductor stack. In some embodiments, the vacuum of the process chamber is not broken before the epitaxial growth of the semiconductor stack is accomplished.

Figure 2B:
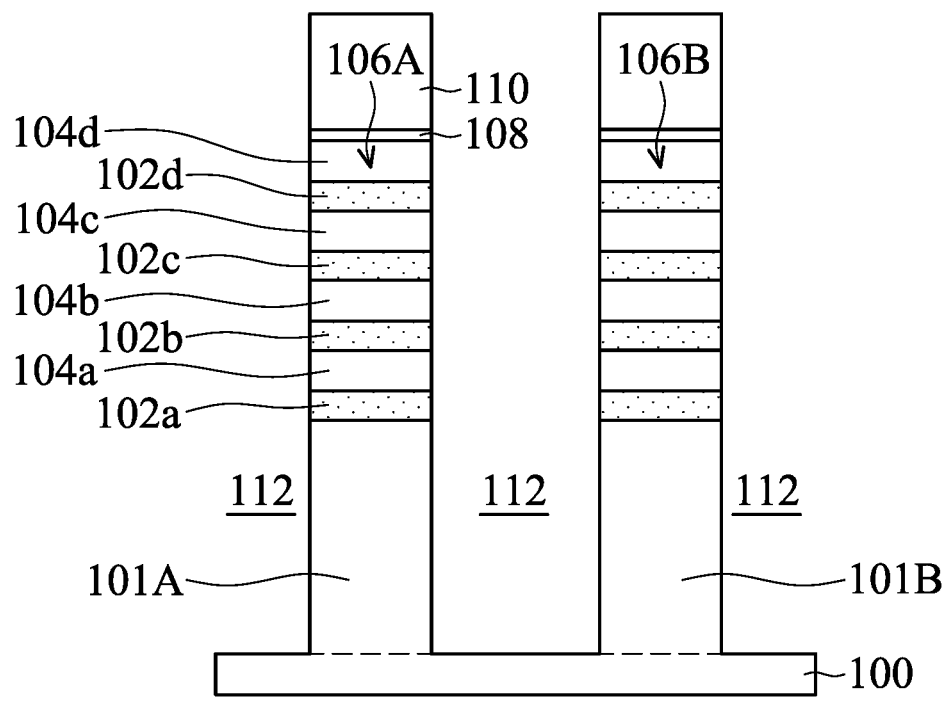

Afterwards, hard mask elements are formed over the semiconductor stack to assist in a subsequent patterning of the semiconductor stack. One or more etching processes are used to pattern the semiconductor stack into fin structures 106A and 106B, as shown in FIG. 2B in accordance with some embodiments. The semiconductor stack is partially removed to form trenches 112, as shown in FIG. 2B. Each of the fin structures 106A and 106B may include portions of the semiconductor layers 102a-102d and 104a-104d and semiconductor fins 101A and 101B. The semiconductor substrate 100 may also be partially removed during the etching process for forming the fin structures 106A and 106B. Protruding portions of the semiconductor substrate 100 form the semiconductor fins 101A and 101B, as shown in FIG. 2B.

Each of the hard mask elements may include a first mask layer 108 and a second mask layer 110. The first mask layer 108 and the second mask layer 110 may be made of different materials. In some embodiments, the first mask layer 108 is made of a material that has good adhesion to the semiconductor layer 104d. The first mask layer 108 may be made of silicon oxide, germanium oxide, silicon germanium oxide, one or more other suitable materials, or a combination thereof. In some embodiments, the second mask layer 110 is made of a material that has good etching selectivity to the semiconductor layers 102a-102d and 104a-104d. The second mask layer 110 may be made of silicon nitride, silicon oxynitride, silicon carbide, one or more other suitable materials, or a combination thereof.

Figure 1B:
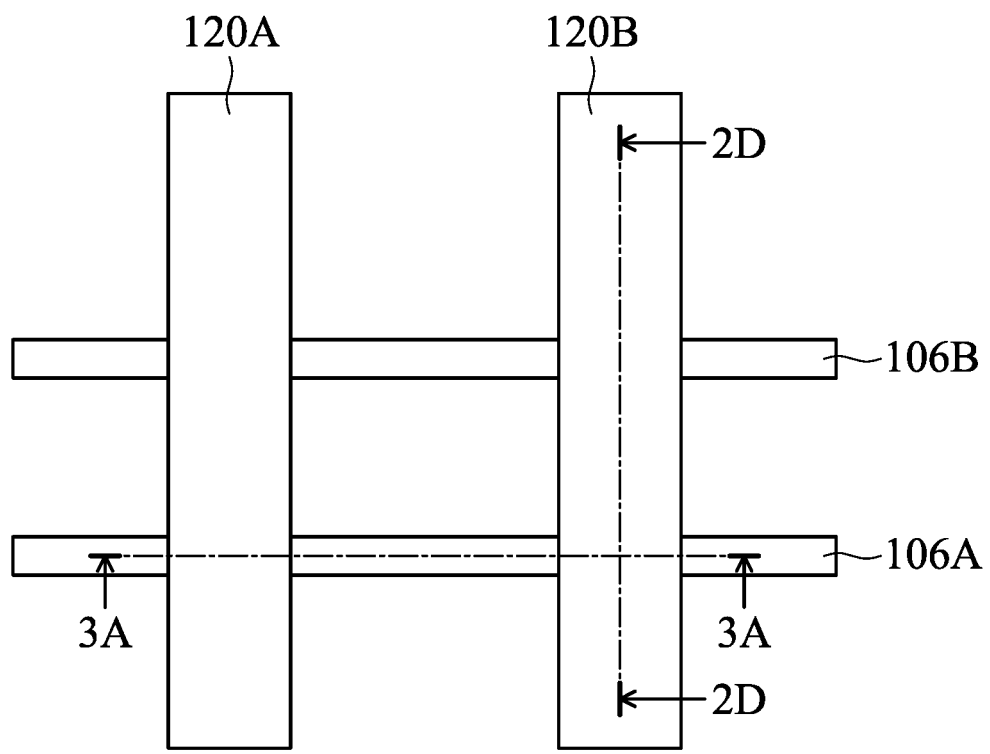

FIGS. 1A-1B are top views of various stages of a process for forming a semiconductor device structure, in accordance with some embodiments. In some embodiments, FIG. 2B is a cross-sectional view of the structure taken along the line 2B-2B in FIG. 1A. In some embodiments, the extending directions of the fin structures 106A and 106B are substantially parallel to each other, as shown in FIG. 1A.

Figure 2C:
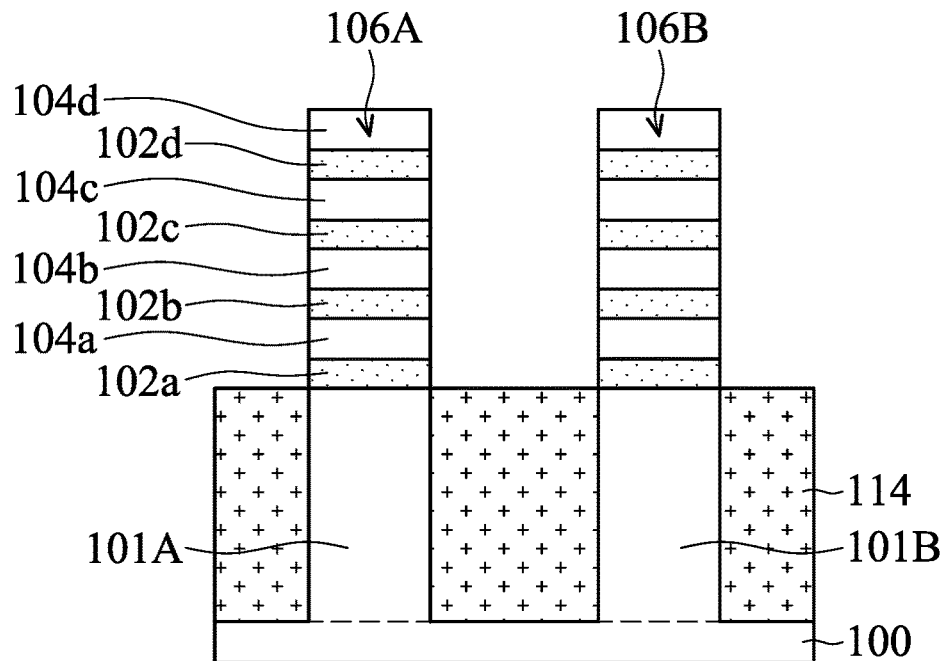

As shown in FIG. 2C, an isolation structure 114 is formed to surround lower portions of the fin structures 106A and 106B, in accordance with some embodiments. In some embodiments, one or more dielectric layers are deposited over the fin structures 106A and 106B and the semiconductor substrate 100 to overfill the trenches 112. The dielectric layers may be made of silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof. The dielectric layers may be deposited using a flowable chemical vapor deposition (FCVD) process, an atomic layer deposition (ALD) process, a chemical vapor deposition (CVD) process, one or more other applicable processes, or a combination thereof.

Afterwards, a planarization process is used to partially remove the dielectric layers. The hard mask elements (including the first mask layer 108 and the second mask layer 110) may also function as a stop layer of the planarization process. The planarization process may include a chemical mechanical polishing (CMP) process, a grinding process, a dry polishing process, an etching process, one or more other applicable processes, or a combination thereof. Afterwards, one or more etching back processes are used to partially remove the dielectric layers. As a result, the remaining portion of the dielectric layers forms the isolation structure 114. Upper portions of the fin structures 106A and 106B protrude from the top surface of the isolation structure 114, as shown in FIG. 2C.

Figure 2D:
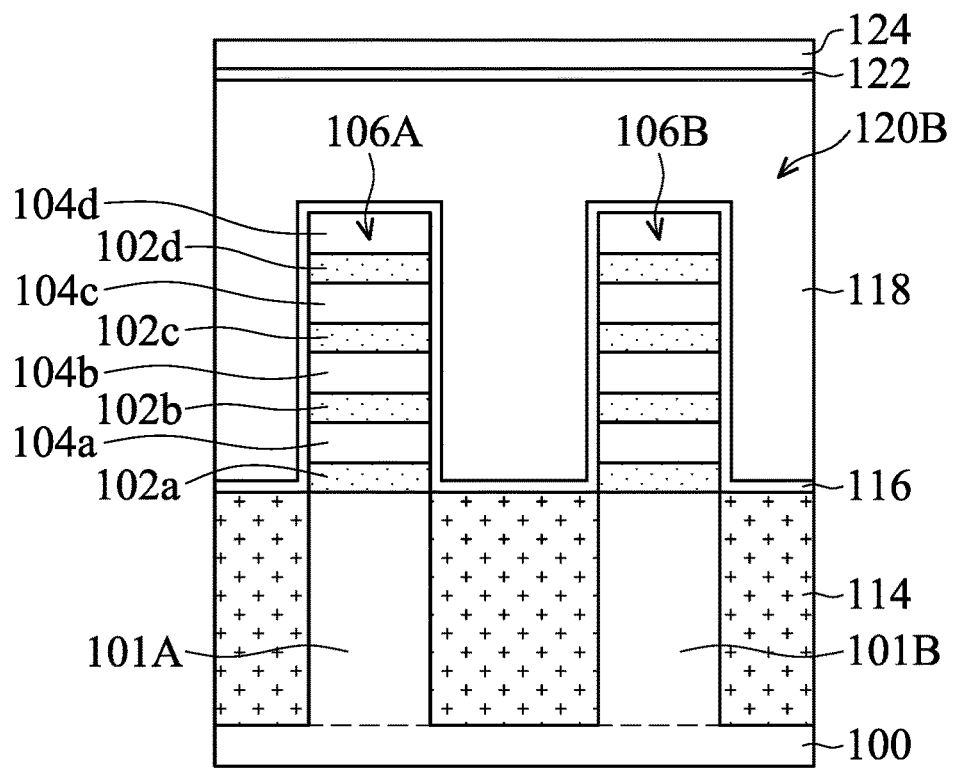
Figure 3A:
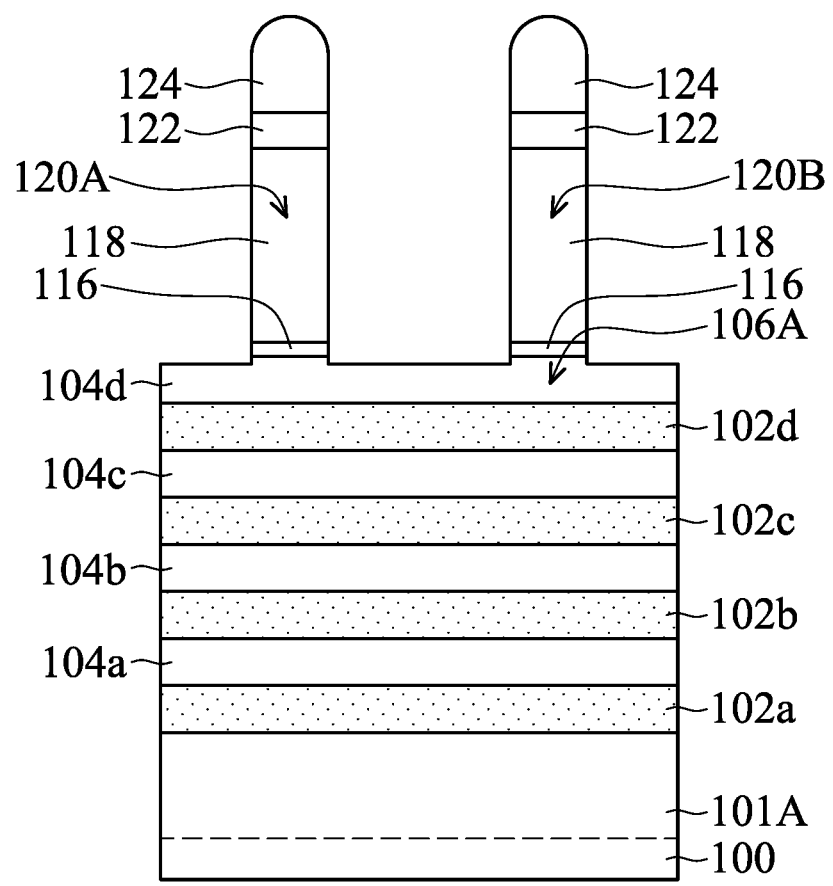
FIGS. 3A-3R are cross-sectional views of various stages of a process for forming a semiconductor device structure, in accordance with some embodiments.

Afterwards, dummy gate stacks 120A and 120B are formed to extend across the fin structures 106A and 106B, as shown in FIG. 1B in accordance with some embodiments. In some embodiments, FIG. 2D is a cross-sectional view of the structure taken along the line 2D-2D in FIG. 1B. FIGS. 3A-3R are cross-sectional views of various stages of a process for forming a semiconductor device structure, in accordance with some embodiments. In some embodiments, FIG. 3A is a cross-sectional view of the structure taken along the line 3A-3A in FIG. 1B.

As shown in FIGS. 1B, 2D, and 3A, the dummy gate stacks 120A and 120B are formed to partially cover and to extend across the fin structures 106A and 106B, in accordance with some embodiments. In some embodiments, the dummy gate stacks 120A and 120B wrap around the fin structures 106A and 106B. As shown in FIG. 2D, the dummy gate stack 120B extends across and wraps around the fin structures 106A and 106B.

As shown in FIGS. 2D and 3A, each of the dummy gate stacks 120A and 120B includes a dummy gate dielectric layer 116 and a dummy gate electrode 118. The dummy gate dielectric layers 116 may be made of or include silicon oxide. The dummy gate electrodes 118 may be made of or include polysilicon. In some embodiments, a dummy gate dielectric material layer and a dummy gate electrode layer are sequentially deposited over the isolation structure 114 and the fin structures 106A and 106B. The dummy gate dielectric material layer and the dummy gate electrode layer may be sequentially deposited using a CVD process, an ALD process, one or more other applicable processes, or a combination thereof.

Afterwards, the dummy gate dielectric material layer and the dummy gate electrode layer are patterned to form the dummy gate stacks 120A and 120B. In some embodiments, hard mask elements including mask layers 122 and 124 are used to assist in the patterning process for forming the dummy gate stacks 120A and 120B. With the hard mask elements as an etching mask, one or more etching processes are used to partially remove the dummy gate dielectric material layer and the dummy gate electrode layer. As a result, remaining portions of the dummy gate dielectric material layer and the dummy gate electrode layer form the dummy gate dielectric layers 116 and the dummy gate electrodes 118 of the dummy gate stacks 120A and 120B, respectively.

Figure 3B:
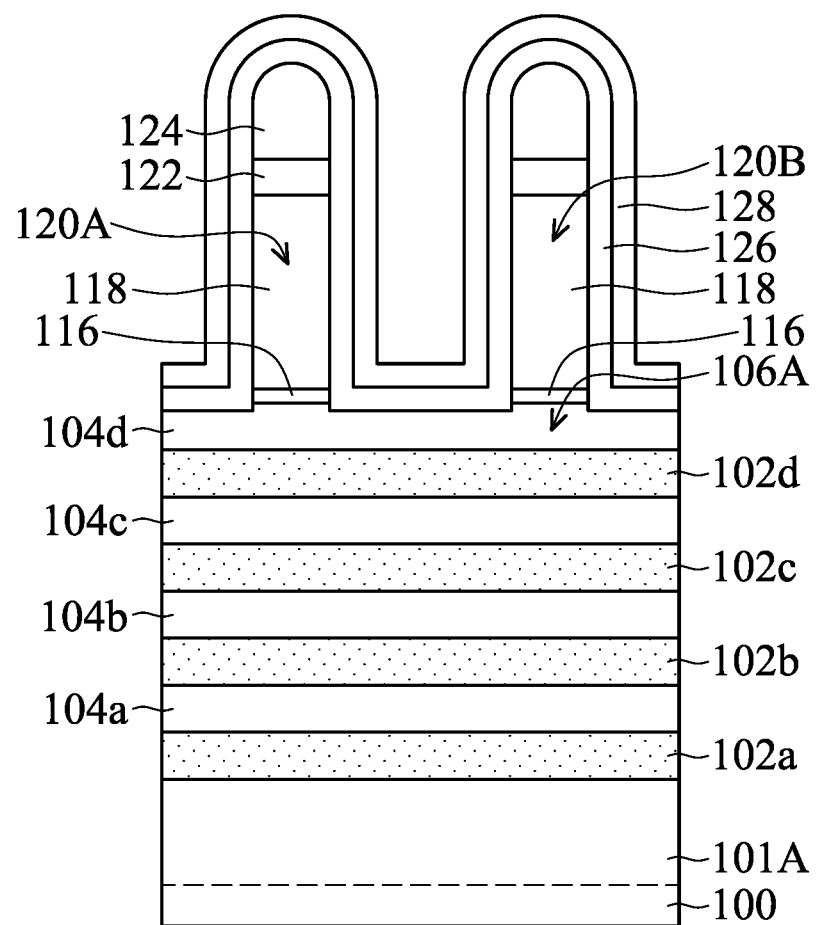

As shown in FIG. 3B, spacer layers 126 and 128 are deposited over the structure shown in FIG. 3A, in accordance with some embodiments. The spacer layers 126 and 128 extend along the sidewalls of the dummy gate stacks 120A and 120B. The spacer layers 126 and 128 are made of different materials. The spacer layer 126 may be made of a dielectric material that has a low dielectric constant. The spacer layer 126 may be made of or include silicon carbide, silicon oxycarbide, silicon oxide, one or more other suitable materials, or a combination thereof.

The spacer layer 128 may be made of a dielectric material that can provide more protection to the gate stacks during subsequent processes. The spacer layer 128 may have a dielectric constant greater than that of the spacer layer 126. The spacer layer 128 may be made of silicon nitride, silicon oxynitride, carbon-containing silicon nitride, carbon-containing silicon oxynitride, one or more other suitable materials, or a combination thereof. The spacer layers 126 and 128 may be sequentially deposited using a CVD process, an ALD process, a physical vapor deposition (PVD) process, one or more other applicable processes, or a combination thereof.

Figure 3C:
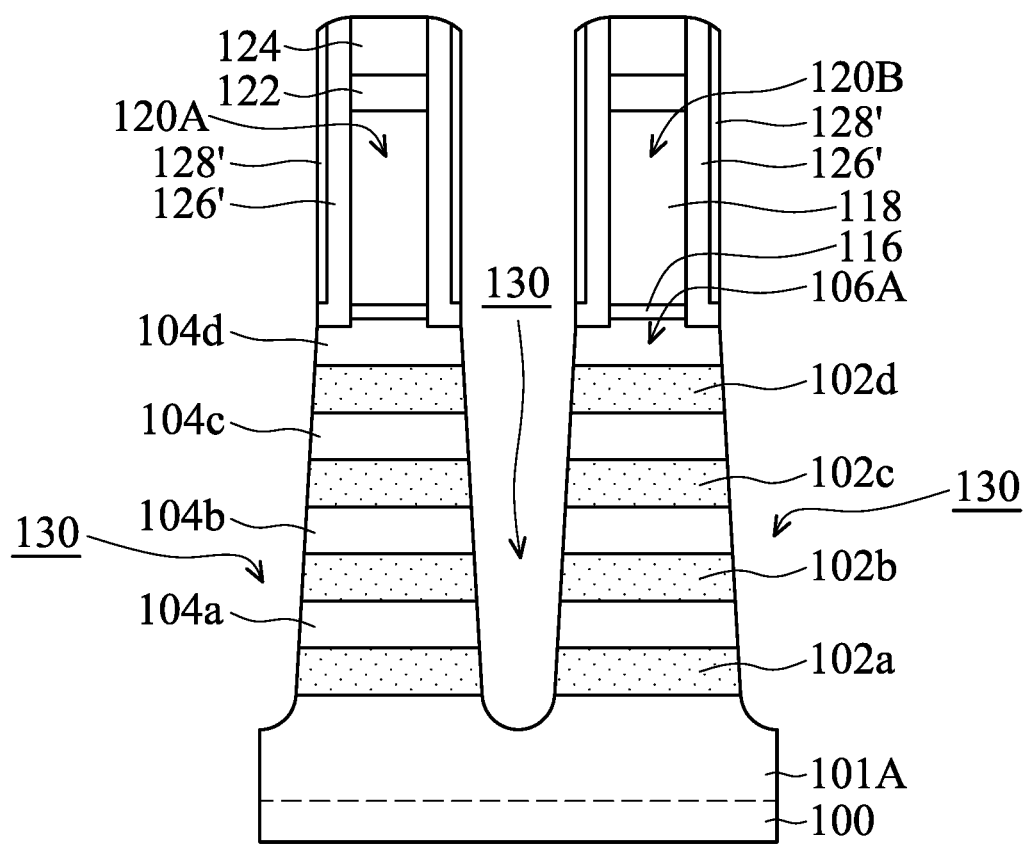

As shown in FIG. 3C, the spacer layers 126 and 128 are partially removed, in accordance with some embodiments. One or more anisotropic etching processes may be used to partially remove the spacer layers 126 and 128. As a result, remaining portions of the spacer layers 126 and 128 form spacer elements 126' and 128', respectively. The spacer elements 126' and 128' extend along the sidewalls of the dummy gate stacks 120A and 120B, as shown in FIG. 3C.

Afterwards, the fin structures 106A and 106B are partially removed to form recesses 130 that are used to contain epitaxial structures (such as source/drain structures) and conductive contacts that will be formed later. As shown in FIG. 3C, the fin structure 106A is partially removed to form the recesses 130, in accordance with some embodiments. One or more etching processes may be used to form the recesses 130. In some embodiments, a dry etching process is used to form the recesses 130. Alternatively, a wet etching process may be used to form the recesses 130. In some embodiments, each of the recesses 130 penetrates through the fin structure 106A. In some embodiments, the recesses 130 further extend into the semiconductor fin 101A, as shown in FIG. 3C. In some other embodiments, the recesses 130 further extend into the semiconductor substrate 100.

In some embodiments, the same etching process is used to form the spacer elements 126' and 128' and the recesses 130.

In some other embodiments, separate etching processes are used to form the spacer elements 126' and 128' and the recesses 130.

In some embodiments, each of the recesses 130 has slanted sidewalls. Upper portions of the recesses 130 are larger (or wider) than lower portions of the recesses 130. In these cases, due to the profile of the recesses 130, an upper semiconductor layer (such as the semiconductor layer 104d) is shorter than a lower semiconductor layer (such as the semiconductor layer 104b).

However, embodiments of the disclosure have many variations. In some other embodiments, the recesses 130 have substantially vertical sidewalls. In these cases, due to the profile of the recesses 130, an upper semiconductor layer (such as the semiconductor layer 104d) is substantially as wide as a lower semiconductor layer (such as the semiconductor layer 104b).

Figure 3D:
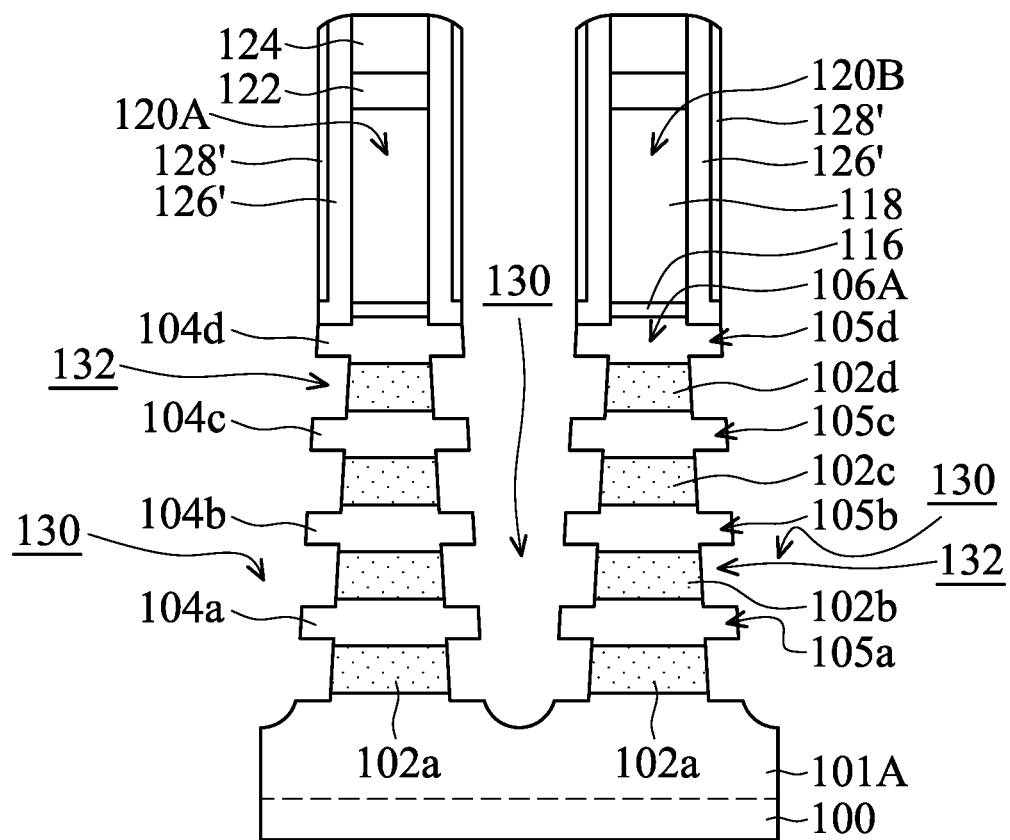

As shown in FIG. 3D, the semiconductor layers 102a-102d are laterally etched, in accordance with some embodiments. As a result, edges of the semiconductor layers 102a-102d retreat (are pulled back) from edges of the semiconductor layers 104a-104d. As shown in FIG. 3D, recesses 132 are formed due to the lateral etching of the semiconductor layers 102a-102d. The recesses 132 may be used to contain inner spacers that will be formed later. The semiconductor layers 102a-102d may be laterally etched using a wet etching process, a dry etching process, or a combination thereof.

During the lateral etching of the semiconductor layers 102a-102d, the semiconductor layers 104a-104d may also be slightly etched. As a result, edge portions of the semiconductor layers 104a-104d are partially etched and thus shrink to become edge elements 105a-105d, as shown in FIG. 3D in accordance with some embodiments. As shown in FIG. 3D, each of the edge elements 105a-105d of the semiconductor layers 104a-104d is thinner than the respective inner portion of the semiconductor layers 104a-104d.

Figure 3E:
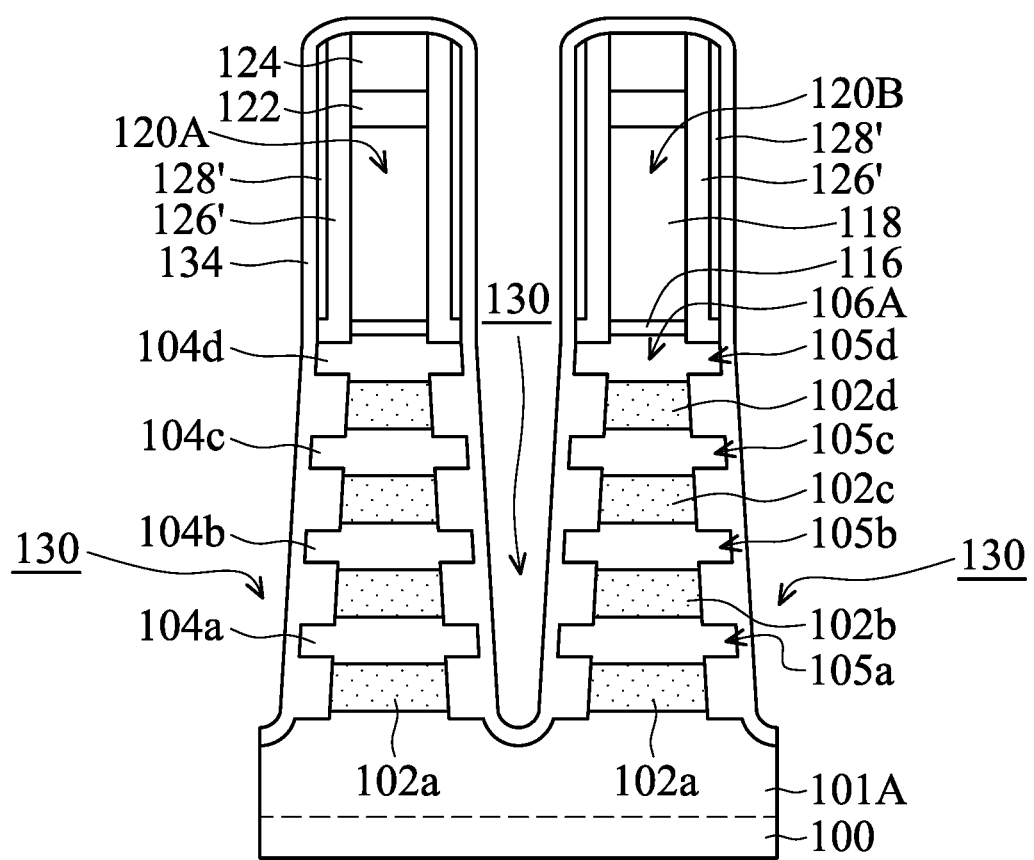

As shown in FIG. 3E, an inner spacer layer 134 is deposited over the structure shown in FIG. 3D, in accordance with some embodiments. The inner spacer layer 134 covers the dummy gate stacks 120A and 120B and overfills the recesses 132. The inner spacer layer 134 may be made of or include carbon-containing silicon nitride (SiCN), carbon-containing silicon oxynitride (SiOCN), carbon-containing silicon oxide (SiOC), one or more other suitable materials, or a combination thereof. In some embodiments, the inner spacer layer 134 is a single layer. In some other embodiments, the inner spacer layer 134 has multiple sub-layers. These sub-layers may be made of different materials. The inner spacer layer 134 may be deposited using an ALD process, a CVD process, one or more other applicable processes, or a combination thereof.

Figure 3F:
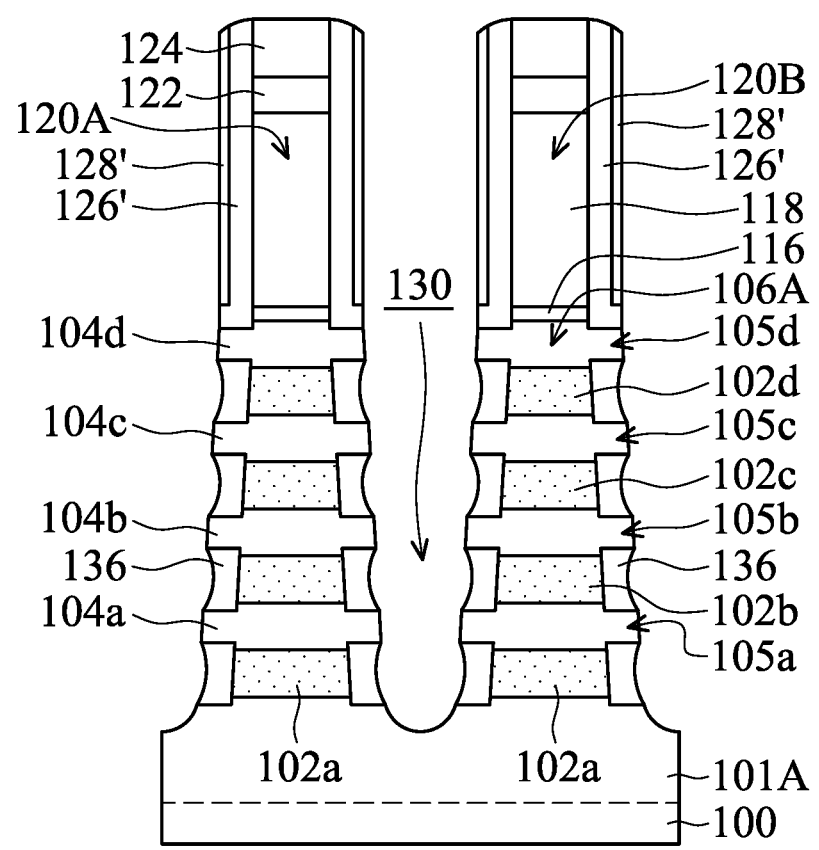

As shown in FIG. 3F, an etching process is used to partially remove the inner spacer layer 134, in accordance with some embodiments. The remaining portions of the inner spacer layer 134 form inner spacers 136, as shown in FIG. 3F. The etching process may include a dry etching process, a wet etching process, or a combination thereof.

The inner spacers 136 cover the edges of the semiconductor layers 102a-102d that are originally exposed by the recesses 132. In some embodiments, after the etching process for forming the inner spacers 136, portions of the semiconductor fin 101A originally covered by the inner spacer layer 134 are exposed by the recesses 130, as shown in FIG. 3F.

However, embodiments of the disclosure are not limited thereto. Many variations and/or modifications can be made to embodiments of the disclosure. In some other embodiments, the portions of the inner spacer layer 134 covering the bottoms of the recesses 130 are not completely removed during the etching process for forming the inner spacers 136. As a result, the bottommost inner spacers 136 may cover the bottoms of the recesses 130. The semiconductor fin 101A is still covered.

The inner spacers 136 may be used to prevent subsequently formed epitaxial structures (that function as, for example, source/drain structures) from being damaged during a subsequent nanosheet (or nanowire) formation process. The inner spacers 136 may also be used to reduce parasitic capacitance between the subsequently formed source/drain structures and the gate stacks. The device operation speed may thus be improved.

Figure 3G:
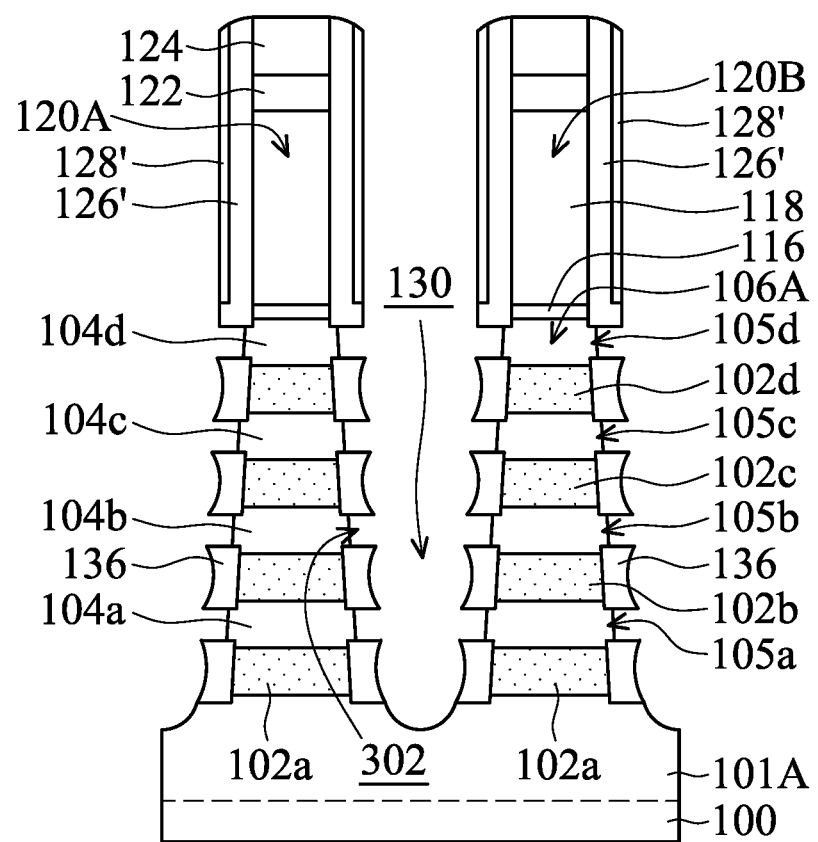

As shown in FIG. 3G, the semiconductor layers 104a-104d are laterally etched, in accordance with some embodiments. As a result, edges of the semiconductor layers 104a-104d retreat (are pulled back) from edges of the inner spacers 136. As shown in FIG. 3G, recesses 302 are formed due to the lateral etching of the semiconductor layers 104a-104d. The semiconductor layers 104a-104d may be laterally etched using a wet etching process, a dry etching process, or a combination thereof.

Figure 3H:
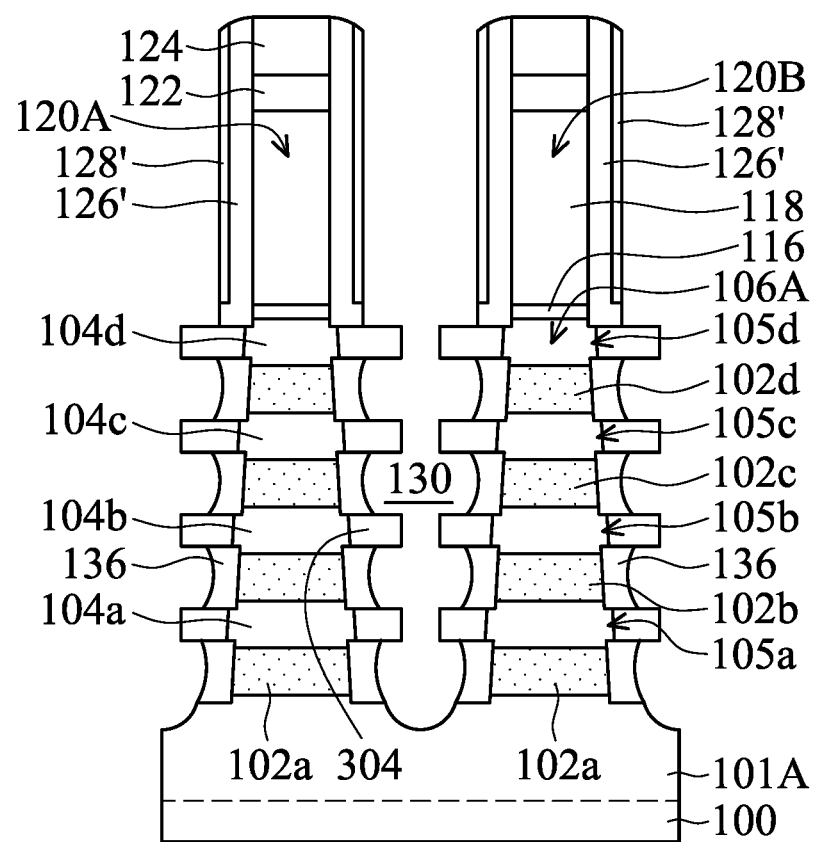

As shown in FIG. 3H, multiple epitaxial structures 304 are formed from the edges of the semiconductor layers 104a-104d, in accordance with some embodiments. Each of the epitaxial structures 304 is formed on a respective edge of the semiconductor layers 104a-104d. The epitaxial structures 304 protrude exceeding outer edges of the inner spacers 136. The epitaxial structures 304 partially occupy the recesses 130. Portions of the recesses 130 remain unoccupied, as shown in FIG. 3H.

In some embodiments, the epitaxial structures 304 connect to the semiconductor layers 104a-104d. Each of the semiconductor layers 104a-104d is sandwiched between respective two epitaxial structures of the epitaxial structures 304. In some embodiments, the epitaxial structures 304 function as source/drain structures. In some embodiments, the epitaxial structures 304 are n-type doped structures. In some other embodiments, the epitaxial structures 304 are p-type doped structures. In some embodiments, the epitaxial structures 304 are made of a semiconductor material that is different than that of the semiconductor layers 104a-104d used for forming channel structures. The epitaxial structures 304 may include epitaxially grown silicon, epitaxially grown silicon carbide (SiC), epitaxially grown silicon phosphide (SiP), or another suitable epitaxially grown semiconductor material. Alternatively, the epitaxial structures 304 may include epitaxially grown silicon germanium, epitaxially grown silicon, or another suitable epitaxially grown semiconductor material.

In some embodiments, the epitaxial structures 304 are formed or grown on the exposed surfaces of the semiconductor layers 104a-104d using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof.

In some embodiments, the epitaxial structures 304 are selectively grown on the exposed semiconductor surfaces of the semiconductor layers 104a-104d without being substantially grown on the exposed surface of the semiconductor fin 101A or the surfaces of the inner spacers 136. In some other embodiments, a semiconductor material (not shown) may also be grown on the exposed surface of the semiconductor fin 101A during the growth of the epitaxial structures 304. In some other embodiments as mentioned earlier, the bottommost inner spacers 136 extend across the bottom portions of the recesses 130 to cover the semiconductor fin 101A. Due to the blocking of the bottommost inner spacers 136, there is no semiconductor material directly grown on the semiconductor fin 101A during the growth of the epitaxial structures 304.

In some embodiments, the epitaxial structures 304 are doped with one or more suitable dopants. In some embodiments, the epitaxial structures 304 are Si source/drain features doped with phosphor (P), antimony (Sb), or another suitable dopant. In some other embodiments, the epitaxial structures 304 are SiGe source/drain features or Si source/drain features that are doped with boron (B), gallium (Ga), indium (In), or another suitable dopant. In some other embodiments, the epitaxial structures 304 are germanium source/drain features doped with one or more suitable dopants.

In some embodiments, the epitaxial structures 304 are doped in-situ during their epitaxial growth. In some other embodiments, the epitaxial structures 304 are not doped during the growth of the epitaxial structures 304. Instead, after the formation of the epitaxial structures 304, the epitaxial structures 304 are doped in a subsequent process. In some embodiments, the doping is achieved by using an ion implantation process, a plasma immersion ion implantation process, a gas and/or solid source diffusion process, one or more other applicable processes, or a combination thereof. In some embodiments, the epitaxial structures 304 are further exposed to one or more annealing processes to activate the dopants. For example, a rapid thermal annealing process is used.

Figure 3I:
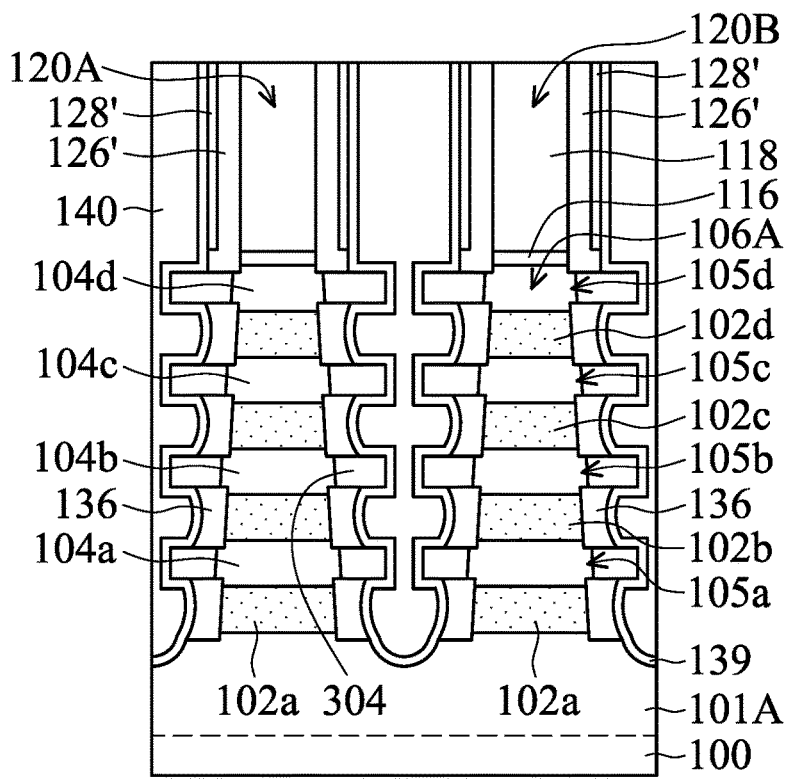

As shown in FIG. 3I, a contact etch stop layer 139 and a dielectric layer 140 are formed to surround the epitaxial structures 304 and the dummy gate stacks 120A and 120B and to fill the recesses 130, in accordance with some embodiments. The contact etch stop layer 139 may be made of or include silicon nitride, silicon oxynitride, silicon carbide, aluminum oxide, one or more other suitable materials, or a combination thereof. The dielectric layer 140 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof.

In some embodiments, an etch stop material layer and a dielectric material layer are sequentially deposited over the structure shown in FIG. 3H. The etch stop material layer may be deposited using a CVD process, an ALD process, a PVD process, one or more other applicable processes, or a combination thereof. The dielectric material layer may be deposited using an FCVD process, a CVD process, an ALD process, one or more other applicable processes, or a combination thereof.

Afterwards, a planarization process is used to partially remove the etch stop material layer and the dielectric material layer. As a result, as shown in FIG. 3I, the remaining portions of the etch stop material layer and the dielectric material layer form the contact etch stop layer 139 and the dielectric layer 140, respectively. The planarization process may include a CMP process, a grinding process, an etching process, a dry polishing process, one or more other applicable processes, or a combination thereof. In some embodiments, the mask layers 122 and 124 (used for defining the dummy gate stacks 120A and 120B) are removed during the planarization process. In some embodiments, after the planarization process, the top surfaces of the contact etch stop layer 139, the dielectric layer 140, and the dummy gate electrodes 118 are substantially coplanar.

Figure 3J:
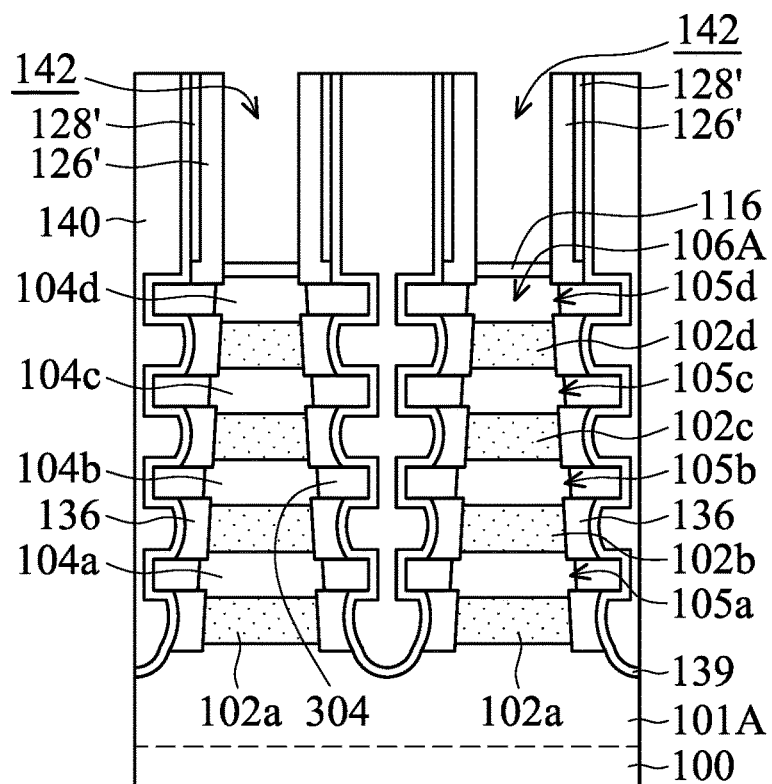

As shown in FIG. 3J, one or more etching processes are used to remove the dummy gate electrodes 118 to form trenches 142, in accordance with some embodiments. The trenches 142 expose the dummy gate dielectric layers 116 that are originally covered by the dummy gate electrodes 118.

Figure 3K:
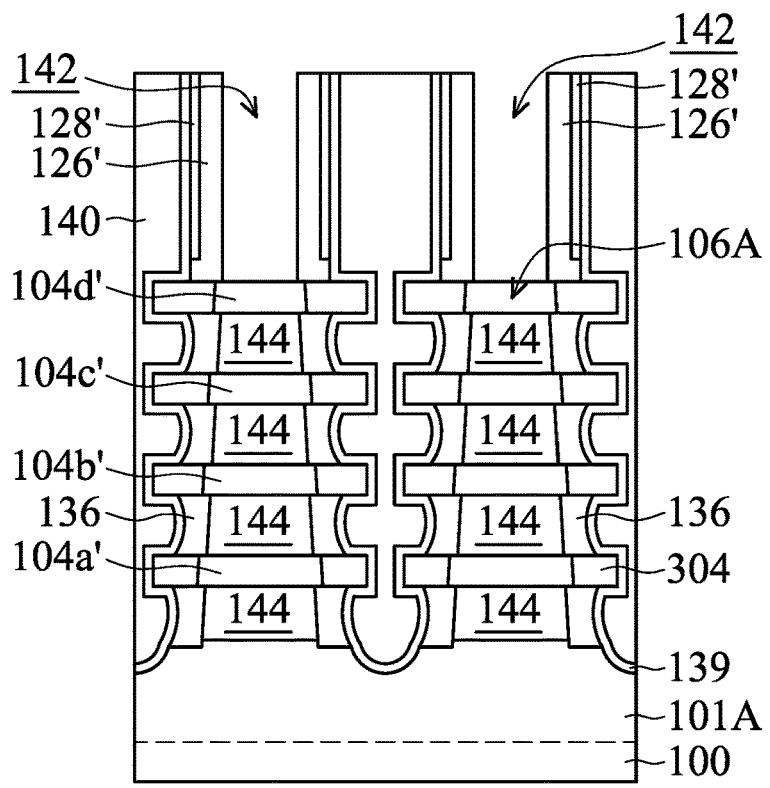

As shown in FIG. 3K, the dummy gate dielectric layers 116 and the semiconductor layers 102a-102d (that function as sacrificial layers) are removed to form recesses 144, in accordance with some embodiments. In some embodiments, one or more etching processes are used to remove the semiconductor layers 102a-102d. In some embodiments, an oxidation process is used to oxidize the semiconductor layers 102a-102d before the etching process(es).

Due to high etching selectivity, the semiconductor layers 104a-104d are slightly (or, in some embodiments, substantially not) etched. The remaining portions of the semiconductor layers 104a-104d form multiple semiconductor nanostructures 104a'-104d', as shown in FIG. 3K. The semiconductor nanostructures 104a'-104d' are constructed by the remaining portions of the semiconductor layers 104a-104d. The semiconductor nanostructures 104a'-104d' may function as channel structures. In some embodiments, each of the semiconductor nanostructures (or channel structures) 104a'-104d' extends exceeding inner edges of the inner spacers 304 that are beside the semiconductor nanostructures 104a'-104d', as shown in FIG. 3K.

In some embodiments, the etchant used for removing the semiconductor layers 102a-102d (or the oxidized semiconductor layers 102a-102d) also slightly removes the semiconductor layers 104a-104d that form the semiconductor nanostructures 104a'-104d'. As a result, the obtained semiconductor nanostructures 104a'-104d' become thinner after the removal of the semiconductor layers 102b-102d. In some embodiments, each of the semiconductor nanostructures 104a'-104d' is substantially as thick as the respective edge portion of the edge portions 105a-105d. In some other embodiments, each of the semiconductor nanostructures 104a'-104d' is thinner than the respective edge portion of the edge portions 105a-105d.

After the removal of the semiconductor layers 102a-102d (that function as sacrificial layers), the recesses 144 are formed. The recesses 144 connect to the trenches 142 and surround each of the semiconductor nanostructures 104a'-104d'. As shown in FIG. 3K, even if the recesses 144 between the semiconductor nanostructures 104a'-104d' are formed, the semiconductor nanostructures 104a'-104d' remain being held or supported by the epitaxial structures 304 that are supported by the dielectric layer 140. Therefore, after the removal of the semiconductor layers 102a-102d (that function as sacrificial layers), the released semiconductor nanostructures 104a'-104d' remain being supported without falling down.

During the removal of the semiconductor layers 102a-102d (that function as sacrificial layers), the inner spacers 136 and the semiconductor nanostructures 104a'-104d' together protect the epitaxial structures 304 from being etched or damaged. The quality and reliability of the semiconductor device structure are ensured and improved.

In some embodiments, there are four semiconductor nanostructures 104a'-104d' formed. However, embodiments of the disclosure are not limited thereto. Many variations and/or modifications can be made to embodiments of the disclosure. In some embodiments, the total number of the semiconductor nanostructures is greater than four. In some other embodiments, the total number of the semiconductor nanostructures is smaller than four. The total number of the semiconductor nanostructures (or channel structures) of each semiconductor device structure may be fine-tuned to meet requirements.

Figure 3L:
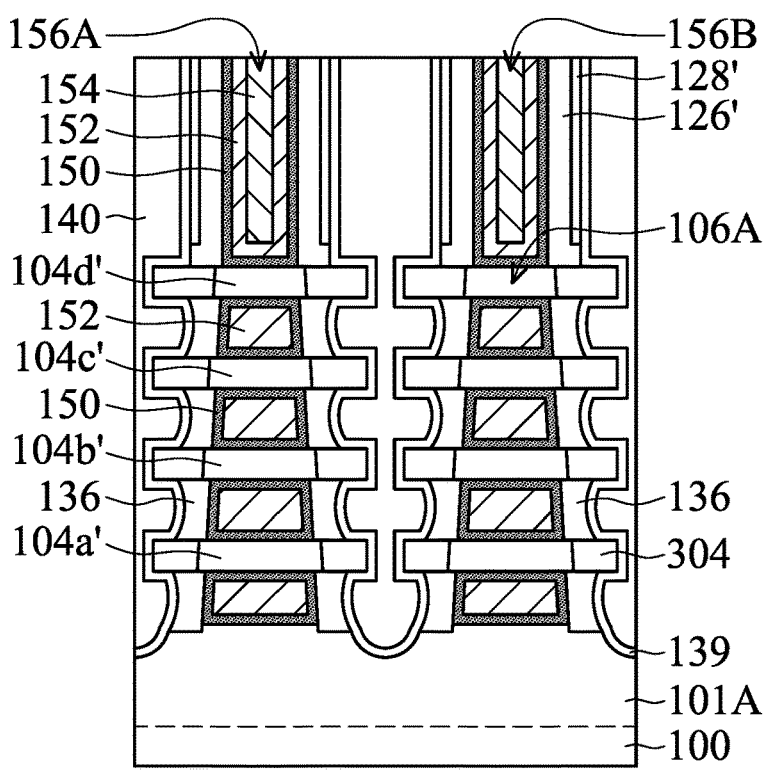

As shown in FIG. 3L, metal gate stacks 156A and 156B are formed to fill the trenches 142, in accordance with some embodiments. The metal gate stacks 156A and 156B extend into the recesses 144 to wrap around each of the semiconductor nanostructures 104a'-104d'. Each of the metal gate stacks 156A and 156B includes multiple metal gate stack layers. Each of the metal gate stacks 156A and 156B may include a gate dielectric layer 150, a work function layer 152, and a conductive filling 154. In some embodiments, the formation of the metal gate stacks 156A and 156B involves the deposition of multiple metal gate stack layers over the dielectric layer 140 to fill the trenches 142. The metal gate stack layers further extend into the recesses 144 to wrap around each of the semiconductor nanostructures 104a'-104d'.

In some embodiments, the gate dielectric layer 150 is made of or includes a dielectric material with high dielectric constant (high-K). The gate dielectric layer 150 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 150 may be deposited using an ALD process, a CVD process, one or more other applicable processes, or a combination thereof.

In some embodiments, before the formation of the gate dielectric layer 150, an interfacial layers are formed on the surfaces of the semiconductor nanostructures 104a'-104d'. The interfacial layers are very thin and are made of, for example, silicon oxide, germanium oxide, or silicon germanium oxide. In some embodiments, the interfacial layers are formed by applying an oxidizing agent on the surfaces of the semiconductor nanostructures 104a'-104d'. For example, a hydrogen peroxide-containing liquid may be applied or provided on the surfaces of the semiconductor nanostructures 104a'-104d' so as to form the interfacial layers.

The work function layer 152 may be used to provide the desired work function for transistors to enhance device performance including improved threshold voltage. In some embodiments, the work function layer 152 is used for forming an NMOS device. The work function layer 152 is an n-type work function layer. The n-type work function layer is capable of providing a work function value suitable for the device, such as equal to or less than about 4.5 eV.

The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function is an aluminum-containing layer. The aluminum-containing layer may be made of or include TiAlC, TiAlO, TiAlN, one or more other suitable materials, or a combination thereof.

In some embodiments, the work function layer 152 is used for forming a PMOS device. The work function layer 152 is a p-type work function layer. The p-type work function layer is capable of providing a work function value suitable for the device, such as equal to or greater than about 4.8 eV.

The p-type work function layer may include metal, metal carbide, metal nitride, other suitable materials, or a combination thereof. For example, the p-type metal includes tantalum nitride, tungsten nitride, titanium, titanium nitride, one or more other suitable materials, or a combination thereof.

The work function layer 152 may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer 152 may be fine-tuned to adjust the work function level.

The work function layer 152 may be deposited over the gate dielectric layer 150 using an ALD process, a CVD process, a PVD process, an electroplating process, an electroless plating process, one or more other applicable processes, or a combination thereof.

In some embodiments, a barrier layer is formed before the work function layer 152 to interface the gate dielectric layer 150 with the subsequently formed work function layer 152. The barrier layer may also be used to prevent diffusion between the gate dielectric layer 150 and the subsequently formed work function layer 152. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

In some embodiments, the conductive filling 154 are made of or include a metal material. The metal material may include tungsten, aluminum, copper, cobalt, one or more other suitable materials, or a combination thereof. A conductive layer used for forming the conductive filling 154 may be deposited over the work function layer 152 using a CVD process, an ALD process, a PVD process, an electroplating process, an electroless plating process, a spin coating process, one or more other applicable processes, or a combination thereof.

In some embodiments, a blocking layer is formed over the work function layer 152 before the formation of the conductive layer used for forming the conductive filling 154. The blocking layer may be used to prevent the subsequently formed conductive layer from diffusing or penetrating into the work function layer 152. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

Afterwards, a planarization process is performed to remove the portions of the metal gate stack layers outside of the trenches 142, in accordance with some embodiments. As a result, the remaining portions of the metal gate stack layers form the metal gate stacks 156A and 156B, as shown in FIG. 3L. In some embodiments, the conductive filling 154 does not extend into the recesses 144 since the recesses 144 are small and have been filled with other elements such as the gate dielectric layer 150 and the work function layer 152. However, embodiments of the disclosure are not limited thereto. In some other embodiments, a portion of the conductive filling 154 extends into the recesses 144, especially for the lower recesses 144 that may have larger space.

Figure 3M:
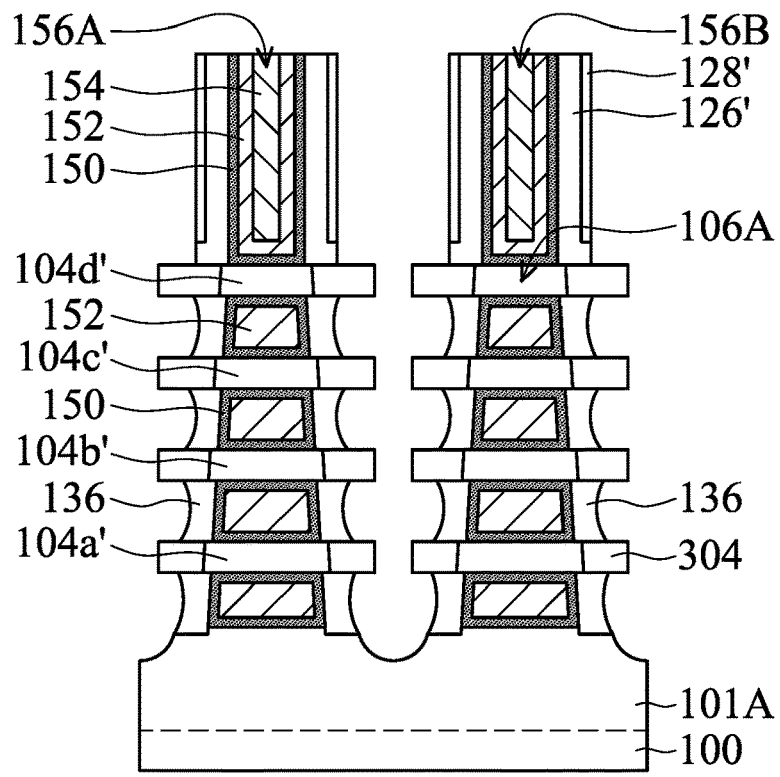

As shown in FIG. 3M, the contact etch stop layer 139 and the dielectric layer 140 are partially removed to form contact openings, in accordance with some embodiments. In some embodiments, the contact openings are formed in a self-aligned manner to expose the epitaxial structures 304 that are between the metal gate stacks 156A and 156B. One or more etching processes may be used to form the contact openings that expose the epitaxial structures 304 and the inner spacers 136, as shown in FIG. 3M.

Figure 3N:
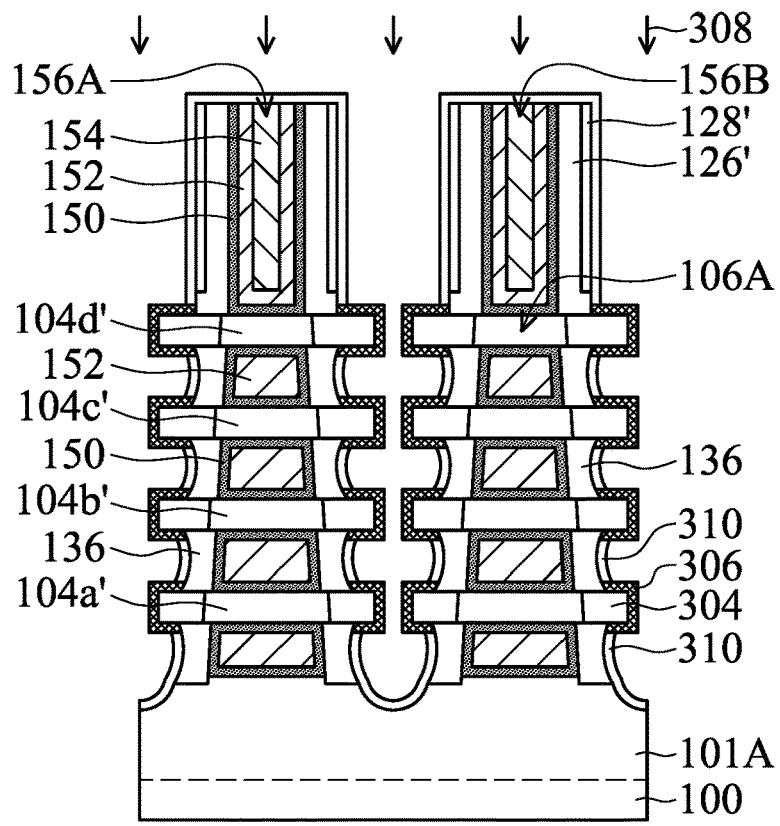

As shown in FIG. 3N, metal-semiconductor compound layers 306 are formed on the surfaces of the epitaxial structures 304 that are exposed by the contact openings, in accordance with some embodiments. In some embodiments, before the formation of the metal-semiconductor compound layers 306, the exposed epitaxial structures 304 are modified to assist in the subsequent formation of the metal-semiconductor compound layers 306. In some embodiments, one or more ion implantation processes are used to reduce the crystallinity of the surface portions of the epitaxial structures 304, which allows a subsequently deposited metal material to react with the modified surface portions more easily. The formation of the metal-semiconductor compound layers 306 may thus be facilitated.

In some embodiments, the implantation process is a plasma doping process. Plasma may be introduced into the contact openings to modify the exposed surface portions of the epitaxial structures 304. In some embodiments, reaction gas used in the implantation process includes silicon-containing gas, germanium-containing gas, argon-containing gas, helium-containing gas, one or more other suitable gases, or a combination thereof.

In some embodiments, a metal-containing material is applied (or deposited) on the epitaxial structures 304 while the epitaxial structures 304 is heated, in accordance with some embodiments. In some embodiments, the metal-containing material is applied (or deposited) using a CVD process. In some embodiments, the metal-containing material is applied (or deposited) using an atomic layer deposition process. Because the metal-containing material is applied during the heating of the epitaxial structures 304, the thermal energy may help to initiate chemical reaction between the surface portions of the epitaxial structures 304 and the metal-containing material. As a result, the surface portions of the epitaxial structures 304 react with the metal-containing material, and they are transformed into the metal-semiconductor compound layers 306. The metal-semiconductor compound layers 306 may be made of or include a metal silicide material, a silicon-germanium-metal-containing material, a germanium-metal-containing material, one or more other suitable materials, or a combination thereof.

As mentioned above, the metal-containing material is applied (or deposited) on the epitaxial structures 304 while the epitaxial structures 304 are heated. In some embodiments, the epitaxial structures 304 are heated to a temperature that is in a range from about 390 degrees C. to about 440 degrees C. In some embodiments, before the metal-containing material is applied (or deposited) on the epitaxial structures 304, the epitaxial structures 304 are heated to be at a raised temperature. Afterwards, the epitaxial structures 304 are kept at the raised temperature while the metal-containing material is applied (or deposited). The raised temperature may be in a range from about 390 degrees C. to about 440 degrees C.

In some embodiments, while applying or depositing the metal-containing material for forming the metal-semiconductor compound layers 306, the metal-containing material is also applied (or deposited) on sidewalls and bottom surfaces of the contact openings to form metal layers. In some embodiments, the metal layers also extend on the surfaces of the inner spacers 136. The metal layers may be made of or include titanium, cobalt, nickel, tantalum, tungsten, platinum, one or more other suitable materials, or a combination thereof.

Afterwards, a modification process 308 is used to transform the metal layers mentioned above into barrier layers 310. In some embodiments, the modification process 308 is a plasma-involved process. In some embodiments, the modification process 308 is a process involving nitrogen-containing plasma. In some embodiments, the reaction gases used for generating the nitrogen-containing plasma include $NH_3$, $N_2$, Ar, $H_2$, or a combination thereof. In some embodiments, the metal layers are nitrogenized by the modification process 308 to become the barrier layers 310. The barrier layers 310 may be made of or include titanium nitride, tantalum nitride, nickel nitride, cobalt nitride, one or more other suitable materials, or a combination thereof.

However, embodiments of the disclosure are not limited thereto. Many variations and/or modifications can be made to embodiments of the disclosure. In some other embodiments, the metal-semiconductor compound layers 306 and/or the barrier layers 310 are not formed.

Figure 3O:
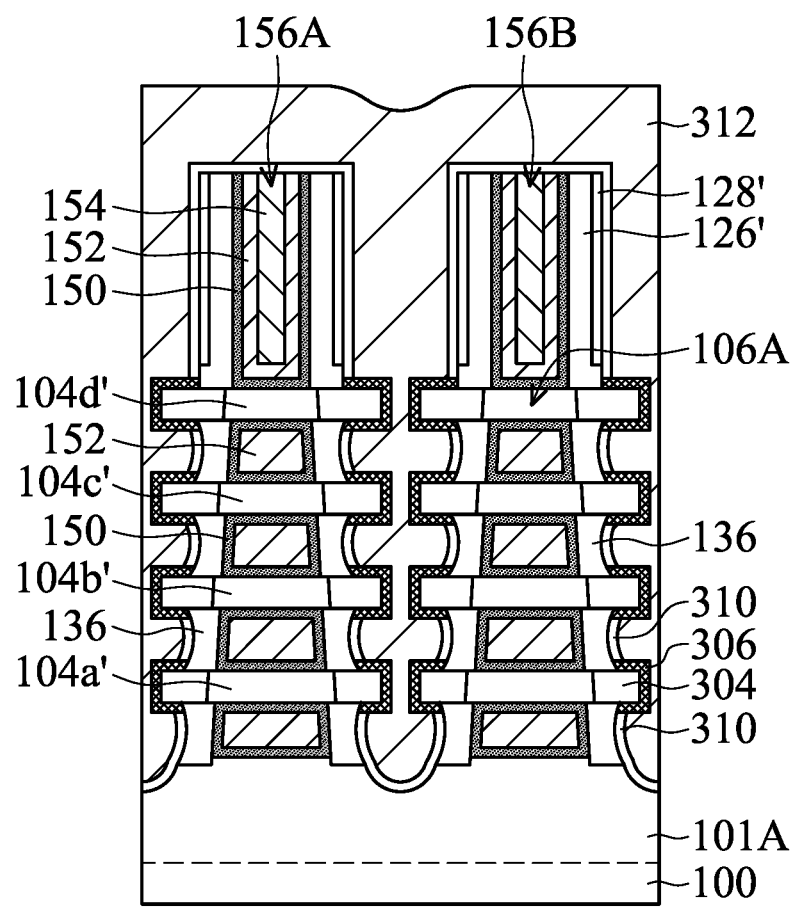

As shown in FIG. 3O, a conductive layer 312 is deposited over the structure shown in FIG. 3N to overfill the contact openings, in accordance with some embodiments. The conductive layer 312 may be made of or include ruthenium, cobalt, tungsten, titanium, molybdenum, tantalum, tungsten, one or more other suitable materials, or a combination thereof. The conductive layer 312 may be deposited using an ALD process, a CVD process, a PVD process, an electroplating process, an electroless plating process, one or more other applicable processes, or a combination thereof.

Figure 3P:
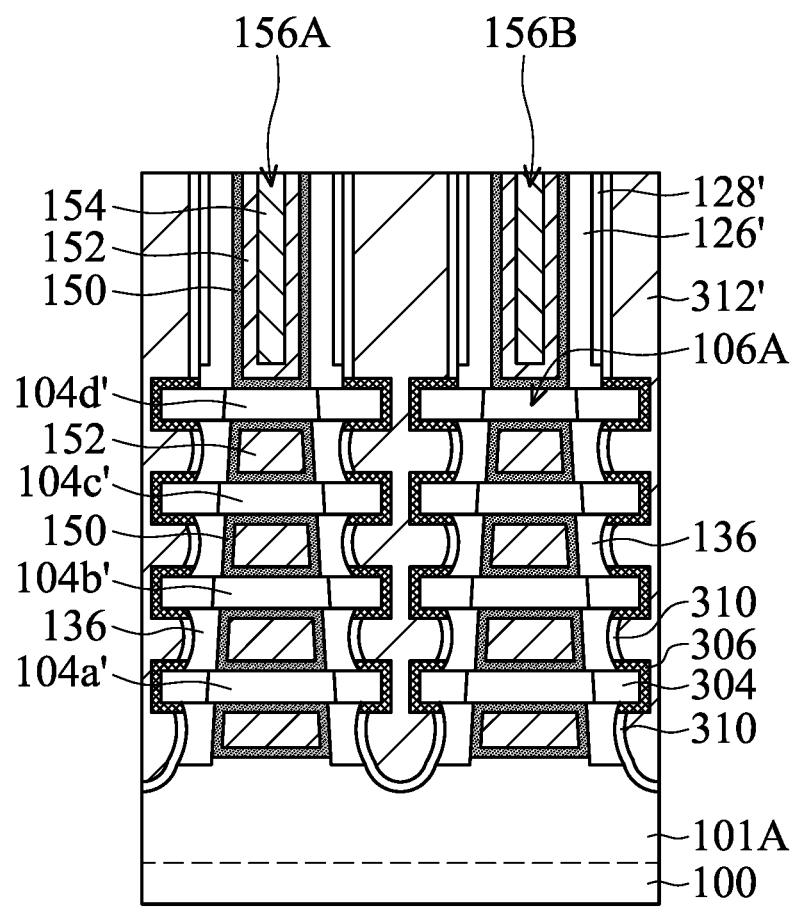

As shown in FIG. 3P, a planarization process is used to remove the conductive layer 312 outside of the contact openings, in accordance with some embodiments. As a result, the remaining portions of the conductive layer 312 in the contact openings form conductive contacts 312'. Each of the conductive contacts 312' is electrically connected to multiple respective epitaxial structures of the epitaxial structures 304. The planarization process mentioned above may include a CMP process, a grinding process, an etching process, a dry polishing process, one or more other applicable processes, or a combination thereof.

In some embodiments, each of the conductive contacts 312' wraps around multiple terminals of the epitaxial structures 304, as shown in FIG. 3P. In some embodiments, a portion of the conductive contact 312' is between two of the epitaxial structures 304. In some embodiments, each of the metal-semiconductor compound layers 306 is between the conductive contact 312' and a respective epitaxial structure of the epitaxial structures 304. In some embodiments, each of the metal-semiconductor compound layers 306 wraps around a respective terminal of the epitaxial structures 304. In some embodiments, each of the epitaxial structures 304 has a bar-shaped profile. In some embodiments, each of the metal-semiconductor compound layers 306 has a clip-shaped profile. In some embodiments, each of the conductive contacts 312' has a comb-shaped profile.

Due to the profiles of the embodiments, the contact area between the conductive contact 312' and the metal-semiconductor compound layers 306 formed on the source/drain structure (i.e., the epitaxial structures 304) is greatly increased. The contact resistance is thus significantly reduced. The performance of the semiconductor device structure is improved.

In some embodiments, the epitaxial structures 304 are physically separated from the conductive contacts 312' by the metal-semiconductor compound layers 306, as shown in FIG. 3P. However, embodiments of the disclosure are not limited thereto. Many variations and/or modifications can be made to embodiments of the disclosure. In some other embodiments, the metal-semiconductor compound layers 306 are not formed. In these cases, each of the epitaxial structures 304 may be in direct contact with a respective conductive contact of the conductive contacts 312'.

Figure 3Q:
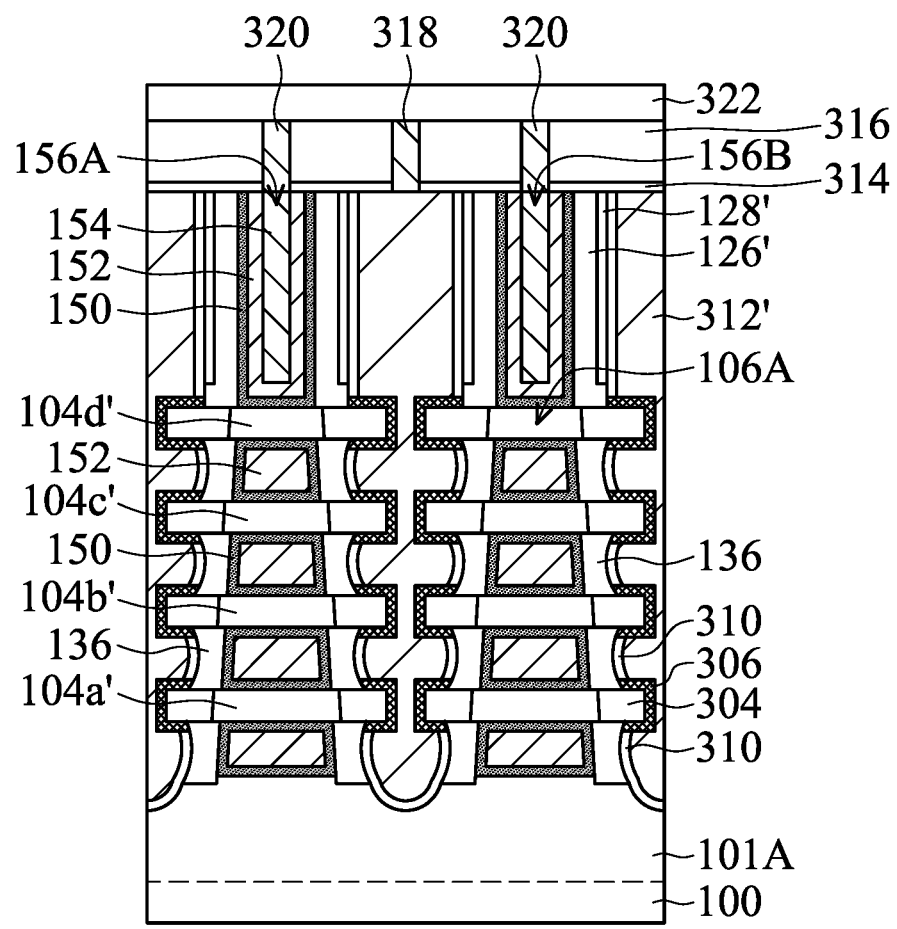
Figure 3R:
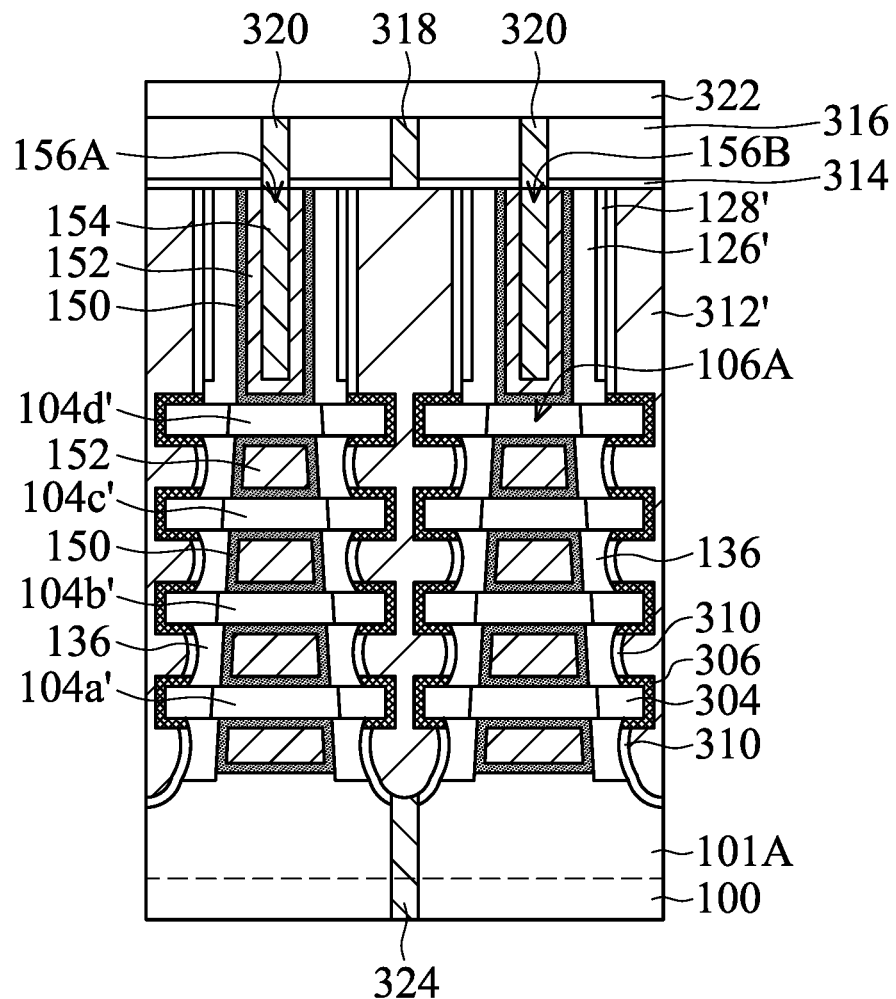

As shown in FIG. 3Q, an etch stop layer 314 and a dielectric layer 316 are sequentially formed over the structure shown in FIG. 3P, in accordance with some embodiments. The materials and formation methods of the etch stop layer 314 and the dielectric layer 316 may be the same as or similar to those of the contact etch stop layer 139 and the dielectric layer 140, respectively.

Afterwards, conductive structures 318 and 320 are formed in the dielectric layer 316, as shown in FIG. 3Q in accordance with some embodiments. The conductive structure 318 penetrates through the etch stop layer 314 to be in electrical contact with the epitaxial structures 304 (that function as source/drain structures) through the conductive contact 312' and the metal-semiconductor compound layers 306. Each of the conductive structures 320 penetrate through the etch stop layer 314 to be in electrical contact with a respective metal gate stack of the metal gate stacks 156A and 156B. The formation of the conductive structures 318 and 320 may involve one or more patterning processes, one or more deposition processes, and one or more planarization processes. The material and formation method of the conductive structures 318 and 320 may be the same as or similar to those of the conductive contacts 312'.

Afterwards, an interconnection structure (or a back-end of line structure) 322 is formed over the dielectric layer 316 and the conductive structures 318 and 320, as shown in FIG. 3Q in accordance with some embodiments. The interconnection structure 322 may include multiple dielectric layers and multiple conductive features including conductive vias and conductive lines. The interconnection structure 322 provides electrical connections between the device elements formed in and/or on the semiconductor substrate 100. For example, some of the conductive features are electrically connected to the conductive structure(s) 318 and/or 320. The formation of the interconnection structure 322 may involve multiple deposition processes, multiple patterning processes, and multiple planarization processes.

As shown in FIG. 3R, a conductive structure 324 is formed in the semiconductor substrate 100, in accordance with some embodiments. The conductive structure 324 extends from the bottom surface of the semiconductor substrate 100 to be in electrical connect with the respective conductive contact 312', as shown in FIG. 3R. In some embodiments, the conductive structure 324 is in direct contact with the respective conductive contact 312'. The conductive structure 324 may be made of or include Ru, Co, W, Ti, Ni, one or more other suitable processes, or a combination thereof.

In some embodiments, a carrier substrate (not shown) is bonded onto the interconnection structure 322 before the formation of the conductive structure 324. The carrier substrate may be a semiconductor wafer such as a silicon wafer or a silicon-on-insulator (SOI) wafer. After bonding with the carrier substrate, the semiconductor substrate 100 is flipped upside down such that the bottom surface of the semiconductor substrate 100 faces upwards. In some embodiments, a thinning process may be used to thin down the thickness of the semiconductor substrate 100. One or more photolithography processes and one or more etching processes are then used to form an opening that exposes the conductive contact 312'. Afterwards, a conductive material is formed to fill the opening. A planarization process is used to remove the excess portion of the conductive material outside of the opening. As a result, the remaining portion of the conductive material in the opening forms the conductive structure 324.

In some embodiments, the conductive structure 324 and the conductive contact 312' are made of metal materials. In some embodiments, the conductive structure 324 and the conductive contact 312' are made of the same metal material such as ruthenium. In some embodiments, since the conductive structure 324 is not in direct contact with a semiconductor material (such as a source/drain structure), it may not be needed to form a metal-semiconductor compound layer over the exposed conductive contact 312' before the formation of the conductive structure 324. The associated process cost and process time for forming different metal-semiconductor compound layers on different regions (such as n-type source/drain regions and p-type source/drain regions) may be avoided. Since no additional metal-semiconductor compound layer needs to be formed, no thermal operation needs to be performed to initiate the reaction between the metal material and the semiconductor material. The conductive features (such as Cu lines and/or Cu vias) that have been formed in the interconnection structure 322 may thus be prevented from being damaged or negatively affected by a high temperature operation. The performance and reliability of the semiconductor device structure are significantly improved.

Figure 4:
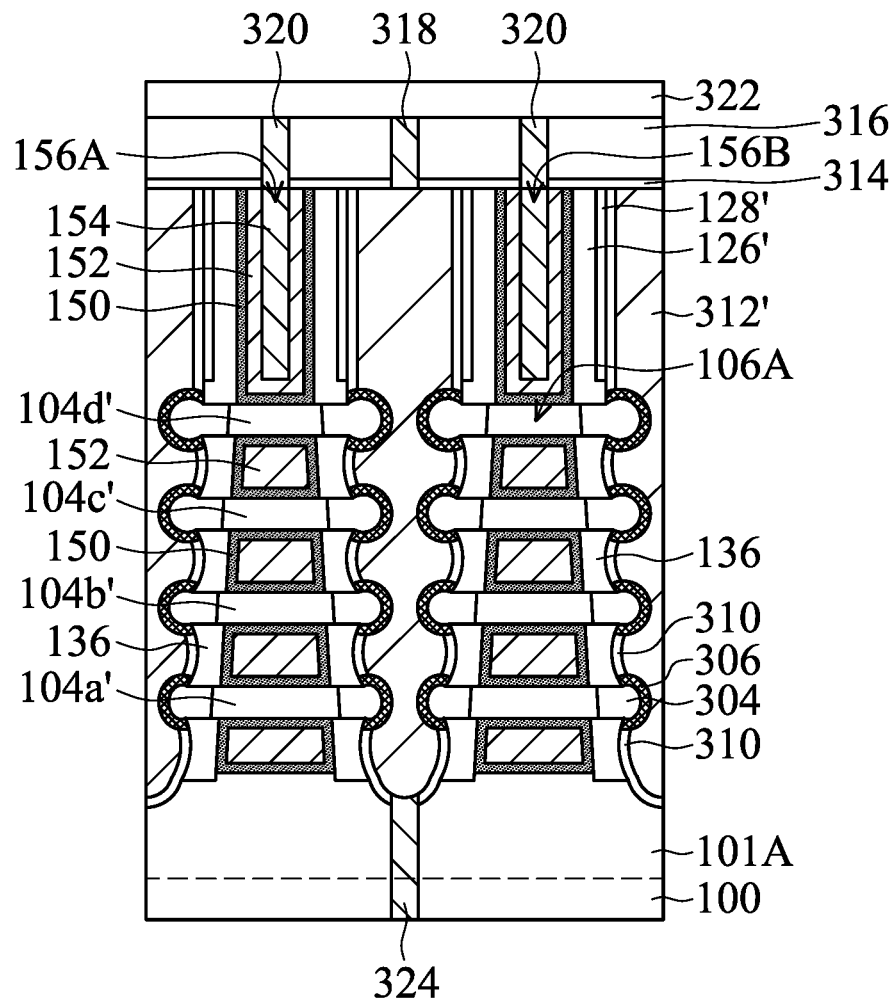
FIG. 4 is a cross-sectional view of a semiconductor device structure, in accordance with some embodiments.

Many variations and/or modifications can be made to embodiments of the disclosure. FIG. 4 is a cross-sectional view of a semiconductor device structure, in accordance with some embodiments. In some embodiments, each of the terminal portions of the epitaxial structures 304 has a different profile than that shown in FIG. 3. In some embodiments, each of the terminal portions of the epitaxial structures 304 has a rounded profile, as shown in FIG. 4. In some embodiments, the metal-semiconductor layers 306 conformally extend on the rounded surfaces of the epitaxial structures 304.

Many variations and/or modifications can be made to embodiments of the disclosure. The profile of the terminal portions of the epitaxial structures 304 may have many variations. In some other embodiments, each of the terminal portions of the epitaxial structures 304 has multiple facets. The shape of the terminal portions of the epitaxial structures 304 may have many variations and is not limited to the profile shown in FIG. 3R or FIG. 4.

Embodiments of the disclosure form a semiconductor device structure with multiple semiconductor nanostructures (such as nanosheets and/or nanowires) that may function as channel structures. The semiconductor device structure includes multiple epitaxial structures extending from edges of the semiconductor nanostructures. The epitaxial structures may function as source/drain structures and further extend into a conductive contact. Therefore, contact area is significantly increased, which allows a lower contact resistance. The performance and reliability of the semiconductor device structure are greatly improved.

In accordance with some embodiments, a semiconductor device structure is provided. The semiconductor device structure includes multiple channel structures suspended over a semiconductor substrate. The semiconductor device structure also includes multiple epitaxial structures extending from edges of the channel structures. The semiconductor device structure further includes a gate stack wrapping around the channel structures. In addition, the semiconductor device structure includes a conductive contact wrapping around terminals of the epitaxial structures.

In accordance with some embodiments, a semiconductor device structure is provided. The semiconductor device structure includes multiple semiconductor nanostructures suspended over a semiconductor substrate. The semiconductor device structure also includes multiple epitaxial structures each connecting a respective side of the semiconductor nanostructures. The semiconductor device structure further includes a gate stack surrounding each of the semiconductor nanostructures. In addition, the semiconductor device structure includes a conductive contact electrically connected to the epitaxial structures. A portion of the conductive contact is between two of the epitaxial structures.

In accordance with some embodiments, a method for forming a semiconductor device structure is provided. The method includes forming a fin structure over a semiconductor substrate. The fin structure has multiple sacrificial layers and multiple semiconductor layers laid out alternately. The method also includes forming multiple epitaxial structures from edges of the semiconductor layers. The method further includes removing the sacrificial layer to release multiple semiconductor nanostructures constructed by remaining portions of the semiconductor layers. In addition, the method includes forming a metal gate stack to wrap around each of the semiconductor nanostructures. The method further includes forming a conductive contact to wrap around terminals of the epitaxial structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a plurality of channel structures suspended over a semiconductor substrate, wherein the channel structures comprise a first semiconductor material;
   a plurality of epitaxial structures extending from edges of the channel structures, wherein the epitaxial structures comprise a second semiconductor material that is different than the first semiconductor material;
   a gate stack wrapped around the channel structures; and
   a conductive contact wrapped around terminals of the epitaxial structures, wherein the conductive contact has a portion extending towards the gate stack and extending exceeding the terminals of the epitaxial structures, and the portion of the conductive contact has a distal end laterally between one of the terminals and one of the edges of the channel structures.

2. The semiconductor device structure as claimed in claim 1, wherein the portion of the conductive contact is separated from the channel structures by the epitaxial structures.

3. The semiconductor device structure as claimed in claim 1, further comprising metal-semiconductor compound layers, wherein each of the metal-semiconductor compound layers is between the conductive contact and a respective epitaxial structure of the epitaxial structures.

4. The semiconductor device structure as claimed in claim 3, wherein each of the metal-semiconductor compound layers wraps around a respective terminal of the terminals of the epitaxial structures.

5. The semiconductor device structure as claimed in claim 3, wherein the epitaxial structures are physically separated from the conductive contact by the metal-semiconductor compound layers.

6. The semiconductor device structure as claimed in claim 1, further comprising a plurality of inner spacers in direct contact with the edges of the channel structures, wherein each of the inner spacers is between the gate stack and the conductive contact.

7. The semiconductor device structure as claimed in claim 6, wherein each of the inner spacers has an inner edge and an outer edge, the inner edge is between the outer edge and the gate stack, and the outer edge is laterally between one of the terminals of the epitaxial structures and one of the edges of the channel structures.

8. The semiconductor device structure as claimed in claim 7, wherein each of the channel structures extends exceeding the inner edges of the inner spacers.

9. The semiconductor device structure as claimed in claim 1, further comprising a conductive structure extending from a bottom surface of the semiconductor substrate to be in electrical contact with the conductive contact.

10. The semiconductor device structure as claimed in claim 1, wherein the conductive contact is made of a metal material.

11. A semiconductor device structure, comprising:
    a plurality of semiconductor nanostructures suspended over a semiconductor substrate;
    a plurality of epitaxial structures each connecting a respective side of the semiconductor nanostructures, wherein each of the epitaxial structures has an inner portion and an outer portion, the inner portion is between the outer portion and the respective side of the semiconductor nanostructures, and the outer portion is thicker than the inner portion;
    a gate stack surrounding each of the semiconductor nanostructures; and
    a conductive contact electrically connected to the epitaxial structures, wherein a portion of the conductive contact is between two of the epitaxial structures, and the conductive contact is separated from the semiconductor nanostructures.

12. The semiconductor device structure as claimed in claim 11, further comprising metal-semiconductor compound layers, wherein each of the metal-semiconductor compound layers is between the conductive contact and a respective epitaxial structure of the epitaxial structures.

13. The semiconductor device structure as claimed in claim 12, wherein each of the metal-semiconductor compound layers wraps around a respective terminal of the epitaxial structures.

14. The semiconductor device structure as claimed in claim 12, wherein each of the epitaxial structures has a bar-shaped profile, each of the metal-semiconductor compound layers has a clip-shaped profile, and the conductive contact has a comb-shaped profile.

15. The semiconductor device structure as claimed in claim 11, wherein the conductive contact is made of a metal material.

16. A semiconductor device structure, comprising:
a first semiconductor nanostructure, a second semiconductor nanostructure, and a third semiconductor nanostructure stacked over a substrate;
a first epitaxial structure connecting the first semiconductor nanostructure;
a second epitaxial structure connecting the second semiconductor nanostructure;
a third epitaxial structure connecting the third semiconductor nanostructure;
a gate stack wrapped around the first semiconductor nanostructure, the second semiconductor nanostructure, and the third semiconductor nanostructure; and
a conductive contact electrically connected to the first epitaxial structure, the second epitaxial structure, and the third epitaxial structure, wherein the conductive contact has a first portion extending towards the gate stack from terminals of the first epitaxial structure and the second epitaxial structures, the conductive contact has a second portion extending towards the gate stack from terminals of the second epitaxial structure and the third epitaxial structures, the conductive contact has a third portion physically connecting the first portion and the second portion, wherein the first portion, the second portion, and the third portion are made of a same material, and the first epitaxial structure is wider than the portion of the conductive contact.

17. The semiconductor device structure as claimed in claim 16, wherein the conductive contact is separated from the first semiconductor nanostructure by the first epitaxial structure.

18. The semiconductor device structure as claimed in claim 16, further comprising an inner spacer between the conductive contact and the gate stack, wherein the inner spacer extends across an interface between the first semiconductor nanostructure and the first epitaxial structure.

19. The semiconductor device structure as claimed in claim 18, wherein the inner spacer has an outer edge laterally between the interface and one of the terminals of the first epitaxial structure and the second epitaxial structures.

20. The semiconductor device structure as claimed in claim 16, further comprising metal-semiconductor compound layers, wherein the metal-semiconductor compound layers is wrapped around the terminals of the first epitaxial structure and the second epitaxial structures.

\* \* \* \* \*